United States Patent
Okano

(10) Patent No.: US 7,423,374 B2
(45) Date of Patent: Sep. 9, 2008

(54) ORGANIC ELECTROLUMINESCENT DISPLAY ELEMENT, DISPLAY DEVICE HAVING THE SAME, AND MANUFACTURING METHOD OF THE SAME

(75) Inventor: Kiyoshi Okano, Nara (JP)

(73) Assignee: Sharp Kabushiki Kaisha, Osaka (JP)

(*) Notice: Subject to any disclaimer, the term of this patent is extended or adjusted under 35 U.S.C. 154(b) by 444 days.

(21) Appl. No.: 11/114,881

(22) Filed: Apr. 26, 2005

(65) Prior Publication Data

US 2005/0253508 A1 Nov. 17, 2005

(30) Foreign Application Priority Data

May 17, 2004 (JP) ............... 2004-146618

(51) Int. Cl.
*H01J 1/62* (2006.01)

(52) U.S. Cl. ...................... 313/509; 313/504

(58) Field of Classification Search .................. 313/509
See application file for complete search history.

(56) References Cited

U.S. PATENT DOCUMENTS

| | | | | |
|---|---|---|---|---|
| 5,642,211 | A * | 6/1997 | Okano et al. | 349/41 |
| 6,538,374 | B2 | 3/2003 | Hosokawa | |
| 6,798,132 | B2 * | 9/2004 | Satake | 313/495 |
| 6,900,470 | B2 * | 5/2005 | Kobayashi et al. | 257/88 |
| 6,917,160 | B2 | 7/2005 | Koo et al. | |
| 6,995,035 | B2 * | 2/2006 | Cok et al. | 438/82 |
| 7,034,455 | B2 | 4/2006 | Koo et al. | |
| 7,042,154 | B2 * | 5/2006 | Kobayashi | 313/506 |
| 7,161,184 | B2 * | 1/2007 | Miyagi et al. | 257/88 |
| 7,173,373 | B2 * | 2/2007 | Yamada et al. | 313/505 |
| 7,224,115 | B2 * | 5/2007 | Sato et al. | 313/504 |
| 2002/0158835 | A1 * | 10/2002 | Kobayashi et al. | 345/100 |
| 2005/0194890 | A1 * | 9/2005 | Koo et al. | 313/503 |
| 2006/0017375 | A1 * | 1/2006 | Noguchi et al. | 313/504 |
| 2006/0019573 | A1 | 1/2006 | Koo et al. | |
| 2006/0082284 | A1 * | 4/2006 | Shibusawa | 313/500 |
| 2006/0113900 | A1 * | 6/2006 | Oh | 313/504 |
| 2007/0190887 | A1 | 8/2007 | Sato et al. | |
| 2007/0222380 | A1 * | 9/2007 | Yamazaki et al. | 313/509 |

FOREIGN PATENT DOCUMENTS

JP 2003-316291 A 11/2003

OTHER PUBLICATIONS

Official communication issued in the counterpart Japanese Application No. 2004-146618, mailed on Sep. 10, 2007.

* cited by examiner

*Primary Examiner*—Peter Macchiarolo
(74) *Attorney, Agent, or Firm*—Keating & Bennett, LLP

(57) ABSTRACT

An organic electroluminescent display element includes a substrate, a plurality of first electrodes, an auxiliary electrode, an insulating layer, an organic layer, a second electrode, and a conductive material. The auxiliary electrode is provided between the plurality of first electrodes on the substrate and separated from the plurality of first electrodes. The insulating layer covers the auxiliary electrode, separates and isolates the plurality of first electrodes from each other, and has through holes extending to the auxiliary electrode. The organic layer is provided on each of the plurality of first electrodes. The second electrode covers a whole surface of the insulating layer and the organic layers and allowing light emitted in the organic layers to transmit therethrough. The conductive material is provided in the through holes, for electrically connecting the auxiliary electrode to the second electrode.

7 Claims, 7 Drawing Sheets

LIGHT EMISSION

ORGANIC ELECTROLUMINESCENT DISPLAY ELEMENT, DISPLAY DEVICE HAVING THE SAME, AND MANUFACTURING METHOD OF THE SAME

CROSS REFERENCE TO RELATED APPLICATIONS

This application claims priority under 35 U.S.C. §119 on Patent Application No. 2004-146618 filed in Japan on May 17, 2004, the entire contents of which are hereby incorporated by reference.

BACKGROUND OF THE INVENTION

1. Field of the Invention

The present invention relates to an organic electroluminescent display element, a display device having the organic electroluminescent display element, and a manufacturing method of the organic electroluminescent display element.

2. Description of the Background Art

Flat panel display elements have less power consumption than that of conventionally used cathode ray tubes (CRTs) and enable reduction in thickness of display elements. Flat panel display elements have therefore been increasingly demanded in response to recent diversification of information processing equipments. Examples of flat panel display elements include liquid crystal display elements and electroluminescent (EL) display elements. In particular, organic EL display elements are characterized by their lower driving voltage, all solid-state structure, faster response speed, and self light emission. Organic EL display elements have been actively studied and developed due to these characteristics.

Organic EL display elements are roughly divided into two driving types: a passive matrix type (hereinafter, referred to as "PM type"); and an active matrix type (hereinafter, referred to as "AM type").

PM-type organic EL elements are driven in a line-sequential manner. In order to implement high-luminance PM-type organic EL elements, large instantaneous power must be applied to each pixel (light-emitting layer). Application of such large instantaneous power significantly degrades the light-emitting layers of PM-type organic EL elements. PM-type organic EL elements thus have shorter service life. Especially in organic EL elements having a large number of scanning electrodes (high-definition organic EL elements), a higher voltage is applied to each pixel. Therefore, high-definition organic EL elements have particularly short service life.

On the other hand, AM-type organic EL elements have switching elements (e.g., thin film transistors (TFTs)) respectively corresponding to pixels and the switching elements can therefore be turned ON/OFF on a pixel by pixel basis. In theory, the number of scanning electrodes is not limited in AM-type organic EL elements, and AM-type organic El elements can therefore provide image display which is close to approximately 100% of a frame period. AM-type organic EL elements can thus implement high luminance, high image quality display even when instantaneous luminance is lower than that of PM-type organic EL elements. Since instantaneous luminance of AM-type organic EL elements can be made lower than that of PM-type organic EL elements, a lower driving voltage and longer service life can be implemented in AM-type organic EL elements. Accordingly, AM-type organic EL elements have been particularly actively studied and developed.

FIG. 7 is a schematic cross-sectional view of a conventional organic EL display device 300.

The organic EL display device 300 includes a substrate 301, an organic layer 303 formed on the substrate 301, and a first electrode 302 and a second electrode 304 with the organic layer 303 interposed therebetween.

The first electrode 302 injects holes into the organic layer 303. The second electrode 304 injects electrons into the organic layer 303. The organic layer 303 emits light when holes injected from the first electrode 302 and electrons injected from the second electrode 304 rebond with each other in the organic layer 303. In the organic EL display device 300, the substrate 301 and the first electrode 302 have a light transmitting property and the second electrode 304 has a light reflecting property. Light emitted in the organic layer 303 is therefore output from the organic EL display device 300 through the first electrode 302 and the substrate 301 (bottom emission type).

When the organic EL display device 300 is of AM type, TFTs and electrodes must be provided on the substrate 101. TFTs and electrodes are generally formed from materials having a less light transmitting property. For example, TFTs may be formed from silicon having a low light transmittance. The AM-type organic EL display device 300 therefore has a small ratio of a light-emitting area to a pixel area (aperture ratio).

AM-type organic EL elements can be divided into two types: a current driven type; and a voltage driven type. Current-driven organic EL elements can suppress variation in display capability among pixels and can effectively suppress degradation in display capability due to degradation of light-emitting materials. However, current-driven organic EL elements have a larger number of TFTs provided for pixels, as compared to voltage-driven organic EL elements. Therefore, current-driven organic EL elements have a smaller aperture ratio.

Top-emission type organic EL elements have been proposed in view of the above problems. In top-emission type organic EL elements, a second electrode has a light transmitting property and a first electrode has a light reflecting property. Therefore, light emitted in an organic light-emitting layer can be retrieved from the second electrode side, the opposite side from the substrate having TFTs and electrodes which have a low light transmittance. Top-emission type organic EL display devices therefore have a larger aperture ratio than that of bottom-emission type organic EL display devices. As a result, high-luminance organic EL display devices can be implemented.

In top-emission type organic EL display devices, light emitted in the organic layer is retrieved from the second electrode side. The second electrode is therefore preferably formed from a transparent conductive material having a high light transmittance. Examples of the transparent conductive material include indium tin oxide (ITO), indium zinc oxide (IZO), and the like. However, transparent conductive materials such as ITO have a higher electric resistance than that of low-resistance metal materials, such as silver (Ag) and aluminum (Al), which have been used as an electrode material. The second electrode formed from a transparent conductive material therefore has a high surface resistance, causing a high driving voltage.

When the second electrode has a high surface resistance, voltage drop occurs in a part of the second electrode. Accordingly, when the second electrode of the organic EL display device is formed from a transparent conductive material having a high electric resistance, a uniform voltage is not applied to the second electrode. As a result, uniform image display cannot be provided.

In view of the above problems, a top-emission type organic EL display device has been proposed in which a second electrode is formed from a main electrode of a transparent conductive material and an auxiliary electrode of a low-resistance metal material (for example, U.S. Pat. No. 6,538,374).

FIG. 8 shows a top-emission type organic EL display device 200 described in the above U.S. Patent.

The organic EL display device 200 includes a substrate 211, an electrically insulating film 260 formed on the substrate 211, TFTs 214 embedded in the electrically insulating film 260, a smoothing film 215 formed over the TFTs 214, an organic EL element 201, and an electric connection portion 223. The organic EL element 201 is formed from an upper electrode 270, a lower electrode 220, and an organic light-emitting medium 240. The electric connection portion 223 electrically connects the TFTs 214 with the organic EL display element 201. In the organic EL display device 200, light emitted in the organic EL element 201 is retrieved from the upper electrode 270 side. In the organic EL display device 200, the upper electrode 270 is formed from a main electrode 272 of a transparent conductive material and an auxiliary electrode 271 of a low resistance metal material and therefore the upper electrode 270 has a low surface resistance. As a result, voltage drop is suppressed in the central portion of the screen and uniform image display can therefore be provided. Moreover, a lower driving voltage of the organic EL display device 200 enables reduction in power consumption.

SUMMARY OF THE INVENTION

The auxiliary electrode 271 is preferably formed from a low electric resistance material such as aluminum (Al), an alloy of Al and a transition metal such as scandium (Sc), and the like. However, such a low resistance metal material has a low light transmittance. Accordingly, when the auxiliary electrode 271 is formed from a low resistance metal material, the upper electrode 270 has a lower light transmittance, causing lower light retrieval efficiency and thus lower luminance of the organic EL display device 200.

In the organic EL display device 200, the auxiliary electrode 271 needs to be formed after the smoothing film 215 is formed on the substrate 211. In other words, fabrication of the organic EL display device 200 requires the steps of forming a film of a material of the auxiliary electrode 271 (such as Al) on the substrate 211 by a sputtering method or the like after forming the smoothing film 215, and patterning the formed thin Al film into a desired shape by a photolithography technology. A manufacturing process of the organic EL display device 200 thus includes a large number of steps and is complicated, resulting in high manufacturing cost.

The present invention is made in view of the above problems, and it is an object of the present invention to provide an organic EL display device which is capable of providing image display having high, less uneven luminance and which can be manufactured at low cost.

An organic electroluminescent (EL) display element according to a first aspect of the present invention includes a substrate, a plurality of first electrodes, an auxiliary electrode, an insulating layer, an organic layer, a second electrode, and a conductive material. The plurality of first electrodes are arranged in a prescribed pattern on the substrate. The auxiliary electrode is provided between the plurality of first electrodes on the substrate and separated from the plurality of first electrodes. The insulating layer covers the auxiliary electrode, separates and isolates the plurality of first electrodes from each other, and has through holes extending to the auxiliary electrode. The organic layer is provided on each of the plurality of first electrodes which are separated from each other by the insulating layer. The second electrode covers a whole surface of the insulating layer and the organic layers and allowing light emitted in the organic layers to transmit therethrough. The conductive material is provided in the through holes, for electrically connecting the auxiliary electrode to the second electrode.

In the organic EL display element of the first aspect, the auxiliary electrode is provided on the substrate side of the organic layers. Light emitted in the organic layers is therefore retrieved without passing through the auxiliary electrode. Accordingly, the auxiliary electrode of the organic EL display element of the first aspect may have a low light transmittance. The auxiliary electrode therefore can be formed from a low resistance metal material such as aluminum (Al) and silver (Ag).

In the organic EL display element of the first aspect, the second electrode is connected to the auxiliary electrode by the conductive material provided in the through holes. Therefore, the surface resistance of the second electrode can be effectively reduced. Since voltage drop in the second electrode can be effectively suppressed, the organic EL display element of the first aspect can provide highly uniform image display. The organic EL display element of the first aspect also has a low driving voltage.

In the organic EL display element of the first aspect, light emitted in the organic layers is retrieved through the second electrode. The second electrode of the organic EL display element of the first aspect can have a high light transmitting property. The organic EL display element of the first aspect thus enables implementation of high light retrieval efficiency from the organic layers.

In the organic EL display element of the first aspect, the second electrode covers the whole surface of the insulating layer and the organic layers. In other words, the second electrode is a planar electrode. Therefore, unlike the case where the second electrode is formed from a main electrode and an auxiliary electrode, the patterning step is not required after the film of the second electrode is formed. The organic EL display element of the first aspect can therefore be manufactured with a smaller number of steps, enabling low manufacturing cost.

In the organic EL display element of the first aspect, the first electrodes and the auxiliary electrode may be formed from a same material.

In this case, the first electrodes and the auxiliary electrode can be formed simultaneously. More specifically, the first electrodes and the auxiliary electrode can be simultaneously formed by forming a thin film of a conductive material on the substrate and patterning the conductive thin film into the first electrodes and the auxiliary electrode by a series of photolithography steps. The organic EL display element of the first aspect can therefore be manufactured at lower cost.

In the organic EL display element of the first aspect, the through holes are preferably formed away from the organic layers.

In general, the organic layers are formed after the insulating layer for separating the plurality of first electrodes from each other is formed. When the organic layers are formed from an organic material containing an organic polymer, the organic layers are formed by a wet process such as an ink jet method.

For example, when the organic layers are formed by an ink jet method, ink may scatter into the through holes if the portions where the organic layers are to be formed are close to the through holes. Clogging of the through holes with ink prevents reliable electric connection between the auxiliary electrode and the second electrode. Such clogging of the through holes can be suppressed by forming the through holes away from the organic layers. The above structure can therefore implement reliable electric connection between the second electrode and the auxiliary electrode.

When the organic layers contain an organic material containing low-molecular-weight organic compounds, the organic layers can be formed by a dry process such as a vapor deposition method. In the vapor deposition method, a mask is formed on a portion where the organic layers are not to be formed, such as on the insulating film, and the organic layers are then vapor-deposited. If the organic layers are not sufficiently separated from the through holes, the through holes may be partly exposed in case of misalignment of a mask on the insulating layer. In such a case, the organic material is vapor-deposited also in the through holes. This prevents reliable electric connection between the second electrode and the auxiliary electrode. By forming the through holes away from the organic layers, the through holes can be prevented from being exposed from the mask even when the mask is misaligned on the insulating layer. Therefore, clogging of the through holes with the material of the organic layers can be suppressed, assuring reliable electric connection between the second electrode and the auxiliary electrode. Note that, in order to implement more reliable electric connection between the second electrode and the auxiliary electrode, an inner wall of each of the through holes is separated by at least 5 μm from a contact surface between the insulating layer and the second electrode and a corresponding one of the organic layers.

An organic electroluminescent (EL) display device according to a second aspect of the present invention includes an organic electroluminescent (EL) display element including a substrate, a plurality of first electrodes, an auxiliary electrode, an insulating layer, an organic layer, a second electrode, and a conductive material. The plurality of first electrodes are arranged in a prescribed pattern on the substrate. The auxiliary electrode is provided between the plurality of first electrodes on the substrate and separated from the plurality of first electrodes. The insulating layer covers the auxiliary electrode, separates and isolates the plurality of first electrodes from each other, and has through holes extending to the auxiliary electrode. The organic layer is provided on each of the plurality of first electrodes which are separated from each other by the insulating layer. The second electrode covers a whole surface of the insulating layer and the organic layers and allows light emitted in the organic layers to transmit therethrough. The conductive material is provided in the through holes, for electrically connecting the auxiliary electrode to the second electrode.

As mentioned above, the organic EL display element of the second aspect is capable of providing image display having high, less uneven luminance. The organic EL display element of the second aspect can be manufactured at low cost. Therefore, the organic EL display device having the organic EL display element of the second aspect is also capable of providing image display having high, less uneven luminance, and can be manufactured at low cost.

A manufacturing method according to a third aspect of the present invention relates to a method for manufacturing an organic electroluminescent (EL) display element including a substrate, a plurality of first electrodes, an auxiliary electrode, an insulating layer, an organic layer, a second electrode, and a conductive material. The plurality of first electrodes are arranged in a prescribed pattern on the substrate. The auxiliary electrode is provided between the plurality of first electrodes on the substrate and separated from the plurality of first electrodes. The insulating layer covers the auxiliary electrode, separates and isolates the plurality of first electrodes from each other, and has through holes extending to the auxiliary electrode. The organic layer is provided on each of the plurality of first electrodes which are separated from each other by the insulating layer. The second electrode covers a whole surface of the insulating layer and the organic layers and allows light emitted in the organic layers to transmit therethrough. The conductive material is provided in the through holes, for electrically connecting the auxiliary electrode to the second electrode. The manufacturing method of the third aspect includes a first step of simultaneously forming the plurality of first electrodes and the auxiliary electrode from a same material, and a second step of forming the insulating layer so that the insulating layer covers the auxiliary electrode.

In the manufacturing method of the third aspect, the plurality of first electrodes and the auxiliary electrode are simultaneously formed from the same material. More specifically, the plurality of first electrodes and the auxiliary electrode are simultaneously formed by forming a thin film of a conductive material on the substrate and patterning the conductive thin film into the first electrodes and the auxiliary electrode by a series of photolithography steps. The manufacturing method of the third aspect thus enables an organic EL display element having high, less uneven luminance to be manufactured at lower cost with a smaller number of steps.

In the manufacturing method of the third aspect, the organic layers may be formed by an ink jet method.

A wet process such as an ink jet method requires a smaller number of steps as compared to a conventional film formation method such as a vapor deposition method, and therefore can be conducted at lower cost. Accordingly, the manufacturing method of the third aspect enables an organic EL display element to be manufactured at lower cost.

DETAILED DESCRIPTION OF THE INVENTION

Hereinafter, embodiments of the present invention will be described in detail with reference to the accompanying drawings.

Figure 1:
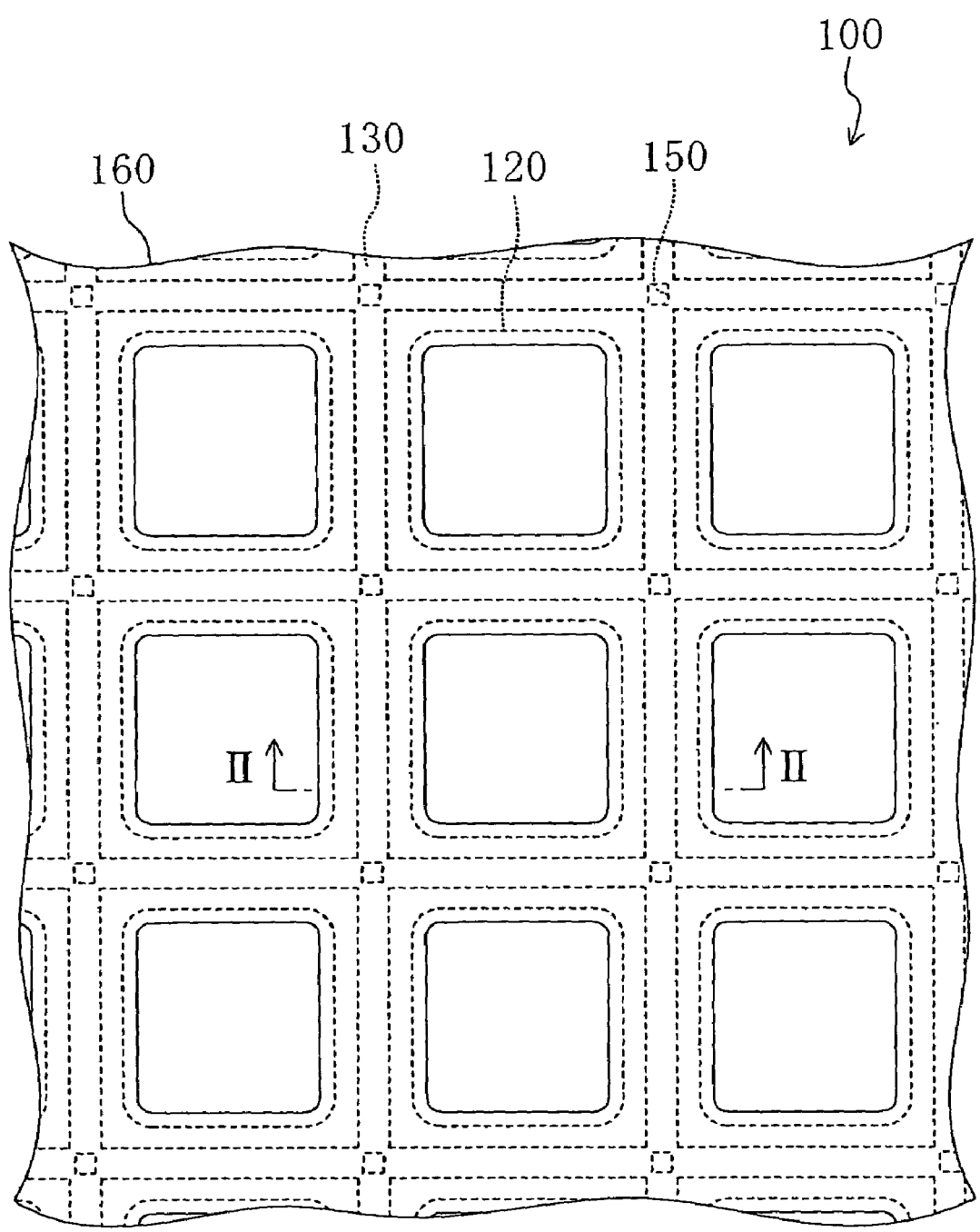
FIG. 1 is a plan view of an organic EL display element according to an embodiment of the present invention.

FIG. 1 is a plan view of an organic EL display element 100 according to an embodiment of the present invention.

Figure 2:
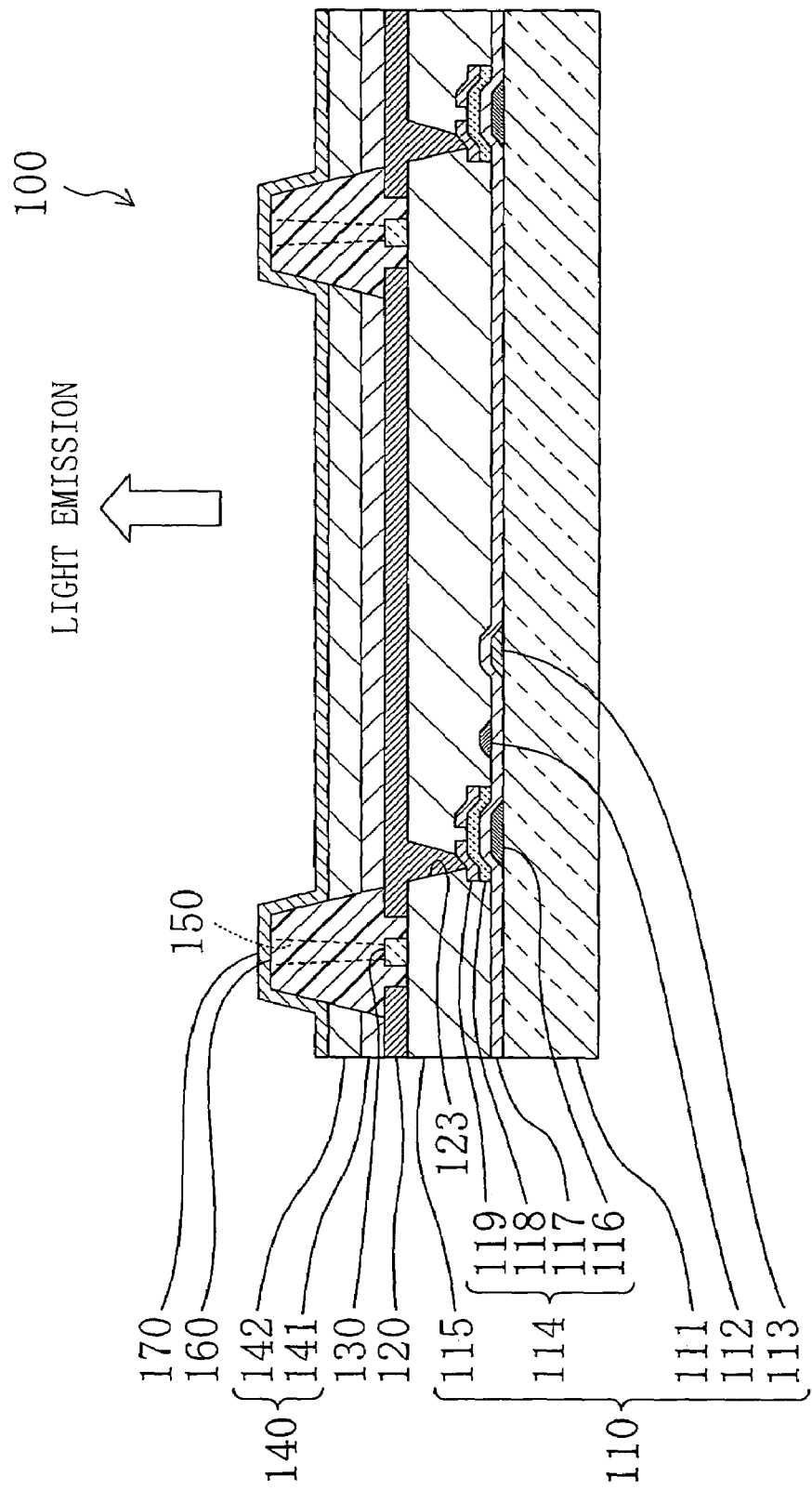
FIG. 2 is a schematic cross-sectional view taken along line II-II in FIG. 1.

FIG. 2 is a schematic cross-sectional view taken along line II-II of FIG. 1.

The organic EL display element 100 includes a substrate 110, a plurality of first electrodes 120, an auxiliary electrode 130, an insulating layer 160, a plurality of organic layers 140, and a second electrode 170. The plurality of first electrodes 120 are arranged in a prescribed pattern on the substrate 110. The auxiliary electrode 130 is provided between the first electrodes 120 on the substrate 110 and is separated from the first electrodes 120. The insulating film 160 separates the plurality of first electrodes 120 from each other. The plurality of organic layers 140 are formed on the respective first electrodes 120. The second electrode 170 covers the whole surface of the insulating layer 160 and the plurality of organic layers 140.

The substrate 110 has an insulating substrate 111, TFTs 114, source electrodes 112, gate electrodes 113, and a smoothing film 115. The TFTs 114 are electrically connected to the plurality of first electrodes 120, respectively. Each source electrode 112 and each gate electrode 113 are electrically connected to corresponding TFTs 114. The smoothing film 115 functions to smooth the organic layer 140 side of the substrate 110.

The insulating substrate 111 is preferably an insulating substrate capable of assuring mechanical strength of the organic EL display element 100. More specifically, the insulating substrate 111 can be formed from glass, plastic or the like.

Each TFT 114 has a gate metal 116, a gate insulating film 117, an island-shaped semiconductor 118, and a TFT electrode 119 (bottom gate structure). The gate insulating film 117 is formed on the gate metal 116. The gate insulating film 117 insulates the island-shaped semiconductor 118 from the gate metal 116. The TFT electrode 119 has a hollow shape and covers a peripheral portion of the island-shaped semiconductor 118. In this embodiment, the TFTs 114 have a bottom gate structure. However, the structure of the TFTs is not limited in the present invention. For example, the TFTs 114 may have a top gate structure or the like.

The first electrodes 120 are arranged in a matrix on the substrate 110. Each of the plurality of first electrodes 120 forms a pixel region of the organic EL display element 100.

Each of the first electrodes 120 is connected to a corresponding TFT electrode 119 through a corresponding electric connection portion 123 formed in the smoothing film 115. Each of the first electrodes 120 injects holes into a corresponding organic layer 140 according to a signal applied from a corresponding TFT 119.

A material of the first electrodes 120 is not limited. Examples of the material of the first electrodes 120 include metal materials such as silver (Ag) and aluminum (Al), conductive oxides such as indium tin oxide (ITO), and the like. In order to implement high hole injection efficiency into the organic layers 140, the first electrodes 120 are preferably formed from a material having a high work function. Examples of the high work function material include indium tin oxide (ITO) and the like.

In the organic EL display element 100, light emitted in the organic layers 140 is retrieved through the second electrode 170. The first electrodes 120 are therefore preferably formed from a material having a high light reflectance. Examples of the high light reflectance material include silver (Ag), aluminum (Al) and the like.

The first electrodes 120 may have a multi-layer structure including a metal layer having a highly conductive property and a high light reflectance such as Al and an electrode layer having a high work function such as ITO. This structure can implement the first electrodes 120 having a high light reflectance and high hole injection efficiency and therefore can improve luminance of the organic EL display element 100.

Although the first electrodes 120 of the organic EL display element 100 have a rectangular shape, the present invention is not limited to this. The first electrodes 120 may have an approximately rectangular shape, an approximately circular shape, an approximately elliptical shape or the like.

When the organic layers 140 are formed by a wet process such as an ink jet method, it is preferable to make the first electrodes 120 lyophilic before formation of the organic layers 140. This improves compatibility between the first electrodes 120 and the organic layers 140 and thus enables formation of more uniform organic layers 140. As a result, a less defective organic EL display element 100 can be implemented. For example, the first electrodes 120 can be made lyophilic by treatment with UV/O$_3$ or the like.

The insulating layer 160 has a grid shape so as to separate the plurality of first electrodes 120 arranged in a matrix from each other. The insulating layer 160 covers the auxiliary electrode 130. Preferably, the insulating layer 160 is formed from a material whose shape, characteristics and the like are less likely to change due to heating. For example, the insulating layer 160 may be formed from a polyimide, an acrylic resin, a methallyl resin, a novolac resin or the like. More preferably, the insulating layer 160 is formed from a photosensitive resin. When the insulating layer 160 is formed from a photosensitive resin, the insulating layer 160 can be patterned by a photolithography process. The insulating layer 160 can therefore be easily formed without requiring an etching process, a removal process or the like. Examples of the photosensitive resin include a photosensitive polyimide and the like.

When the organic layers 140 are formed by an ink jet method, it is preferable to provide a liquid repelling property (a property to repel liquid containing a material of the organic layers 140) to the insulating layer 160 before formation of the organic layers 140.

This effectively suppresses misplacement of droplets containing the material of the organic layers 140. For example, a liquid repelling property can be provided to the insulating layer 160 by treatment with oxygen plasma, treatment with carbon tetrafluoride plasma, or the like.

The insulating layer 160 has through holes 150 extending to the auxiliary electrode 130. The inner wall of each through hole 150 is preferably separated by at least about 5 μm from the contact surface between the insulating layer 160 and the second electrode 170 and a corresponding one of the organic layers 140. As a result, clogging of the through holes 150 due to misplacement of ink droplets containing the material of the organic layers 140 can thus be suppressed when the organic layers 140 are formed by, e.g., an ink jet method.

Moreover, clogging of the through holes 150 due to misalignment of a mask covering the insulating layer 160 can be suppressed when the organic layers 140 are formed by, e.g., a vacuum deposition method. As a result, the organic EL display element 100 has more reliable electric connection between the second electrode 170 and the auxiliary electrode 130.

The organic layers 140 are respectively formed on the first electrodes 120 which are separated from each other by the grid-like insulating layer 160. Each organic layer 140 is formed from a hole transport layer 141 and a light-emitting layer 142. However, the present invention is not limited to this structure. In the present invention, each organic layer 140 may be formed only from the light-emitting layer 142. Alternatively, each organic layer 140 may be formed from the light-emitting layer 142 and at least one kind of layer selected from the group consisting of a hole injection layer, a hole transport layer 141, an electron transport layer and an electron injection layer.

The hole transport layer 141 transports holes injected from the first electrode 120 to the light-emitting layer 142. Preferably, the hole transport layer 141 has high hole transport efficiency.

Preferable low-molecular-weight materials for the hole transport layer 141 include porphyrin compounds, aromatic tertiary amine compounds, hydrazone compounds, Quinacridone compounds, stilamine compounds, and the like. Examples of aromatic tertiary amines compounds include N,N'-bis-(3-methylphenyl)-N,N'-bis-(phenyl)-benzidine (TPD), N,N'-di(naphthalene-1-yl)-N,N'-diphenyl-benzidine (NPD), and the like. Preferable polymeric materials for the hole transport layer 141 include polyanilines, 3,4-polyethylenedioxythiophene/polystyrenesulfonate (PEDT/PSS), poly(triphenylamine) derivatives, polyvinylcarbazole (PVCz), and the like. Preferable polymeric material precursors for the hole transport layer 141 include poly(P-phenylenevinylene) precursors, poly(P-naphthalene vinylene) precursors, and the like.

The hole transport layer 141 is not limited to a single-layer structure. The hole transport layer 141 may have a multi-layer structure. A hole injection layer may further be provided between the hole transport layer 141 and the light-emitting layer 142. The hole injection layer can improve the hole injection efficiency into the light-emitting layer 142, whereby luminance of the organic EL display element 100 can be improved.

The light-emitting layer 142 emits light when holes injected from the first electrode 120 into the light-emitting layer 142 through the hole transfer layer 141 rebond with electrons injected from the second electrode 170 into the light-emitting layer 142. The light-emitting layer 142 may include a low-molecular-weight light-emitting material. When the light-emitting layer 142 includes a low-molecular-weight light-emitting material, the light-emitting layer 142 can be formed by a vacuum deposition method or the like. The light-emitting layer 142 may include a polymeric light-emitting material. When the light-emitting layer 142 includes a polymeric light-emitting material, the light-emitting layer 142 can be formed by a wet process such as an ink jet method. When a wet process is used, the organic EL display element 100 having a large-area substrate 110 can be manufactured with high accuracy at lower cost with a reduced number of steps.

Examples of the material of the light-emitting layer 142 include poly(2-decyloxy-1,4-phenylene) (DO-PPP), poly[2,5-bis-[2-(N,N,N-triethylammonium)ethoxy]-1,4-phenyl-alto-1,4-phenylene]dibromide (PPP-NEt$^{3+}$), poly[2-(2'-ethylhexyloxy)-5-methoxy-1,4-phenylenevinylene] (MEH-PPV), and the like.

The second electrode 170 is a planar electrode which covers the organic layers 140 and the insulating layer 160. The second electrode 170 injects electrons into the organic layers 140. Since light emitted in the light-emitting layers 142 is retrieved through the second electrode 170, the second electrode 170 is preferably formed from a material having a high light transmittance. In order to implement high electron injection efficiency into the organic layers 140, the second electrode 170 is preferably formed from a material having a low work function. Examples of the low work function material include calcium (Ca), aluminum (Al), and the like.

The second electrode 170 may be a lamination of a metal layer having a low work function such as calcium (Ca) or aluminum (Al) and a transparent electrode layer such as ITO. In this case, both high electron injection efficiency and high light transmittance of the second electrode 170 can be implemented simultaneously. As a result, the organic EL display element 100 having higher luminance can be implemented.

The second electrode 170 is formed also within the through holes 150 and connected to the auxiliary electrode 130. In other words, the second electrode 170 serves also as a conductive material for electric connection to the auxiliary electrode 130.

The auxiliary electrode 130 formed on the substrate 110 has a grid shape so that the auxiliary electrode 130 is separated from the rectangular first electrodes 120 arranged in a matrix. The auxiliary electrode 130 is preferably formed from a material having an excellent electrically conductive property such as Al. Providing the auxiliary electrode 130 can effectively reduce the surface resistance of the second electrode 170 formed from a material of a relatively high electric resistance such as ITO. As a result, voltage drop of the second electrode 170 can be suppressed and generation of uneven image display due to the voltage drop can be effectively suppressed. Accordingly, the organic EL display element 100 capable of providing highly uniform image display can be implemented. Moreover, such a reduced surface resistance of the second electrode 170 results in a reduced driving voltage of the organic EL display element 100.

In the organic EL display element 100, the second electrode 170 is formed also within the through holes 150 in order to connect the second electrode 170 to the auxiliary electrode 130. However, a conductive material (which is different from the second electrode 170) may be formed within the though holes 150 in order to electrically connect the second electrode 170 to the auxiliary electrode 130.

In the organic EL display element 100 of the present embodiment, the auxiliary electrode 130 for reducing the surface resistance of the second electrode 170 is formed on the substrate 110 side of the organic layers 140. Therefore, light emitted in the light-emitting layers 142 can be retrieved with high efficiency even when the auxiliary electrode 130 has a low light transmittance.

When the auxiliary electrode is formed on the second electrode side of the organic layers, the auxiliary electrode is preferably formed from a material having a high light transmittance in order to implement high light retrieval efficiency from the organic layers. In this case, the auxiliary electrode should be formed from indium tin oxide (ITO) or the like instead of a material having a relatively low electric resistance such as aluminum (Al) and silver (Ag). As mentioned above, however, there is no restriction on light transmittance of the auxiliary electrode 130 in the organic EL display element 100 of the present embodiment. The auxiliary electrode 130 can therefore be formed from a low electric resistance material such as Al and Ag. In this case, the electric resistance of the auxiliary electrode 130 can further be reduced and therefore the surface resistance of the second electrode 170 can be reduced more effectively. As a result, the organic EL display element 100 capable of providing more uniform image display can be implemented. Moreover, the auxiliary electrode 130 is formed on the substrate 110 side of the organic layer 140. Therefore, unlike the case where the second electrode 170 is formed from a main electrode and an auxiliary electrode, patterning of the second electrode 170 is not required. As a result, the organic EL display element 100 can be manufactured at low cost by a smaller number of steps.

The auxiliary electrode 130 may be formed from the same material as that of the first electrodes 120 (e.g., silver or aluminum). In this case, the first electrodes 120 and the auxiliary electrode 130 can be simultaneously formed by forming a thin film of a conductive material on the substrate and patterning the conductive thin film into the first electrodes 120 and the auxiliary electrode 130 by photolithography technology. The organic EL display element 100 can therefore be manufactured at lower cost with a smaller number of steps.

In the present embodiment, the auxiliary electrode 130 formed on the substrate 110 has a grid shape. However, the present invention is not limited to this. For example, the auxiliary electrode 130 may have a stripe shape or a radial shape.

Hereinafter, a method for manufacturing the organic EL display element 100 will be described with reference to the accompanying drawings.

Figure 3:
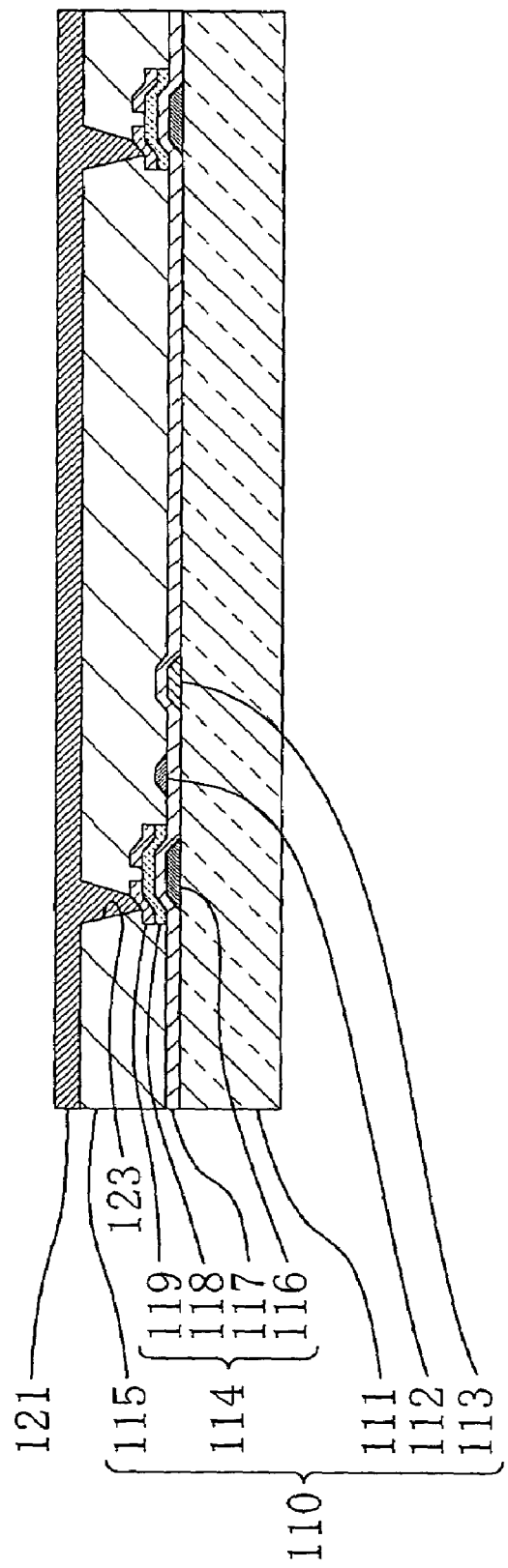
FIG. 3 is a schematic cross-sectional view showing a state in which a conductive film has been formed.

FIG. 3 is a schematic cross-sectional view showing the state in which a conductive film 121 has been formed.

Figure 4:
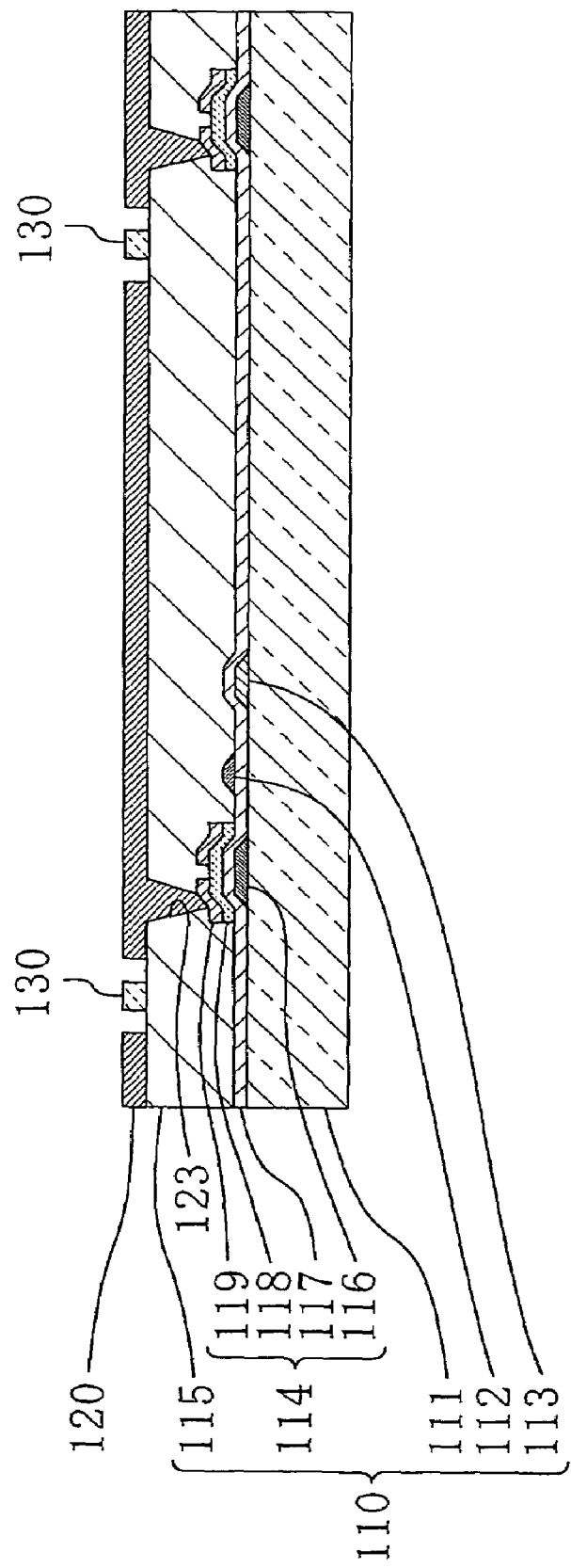
FIG. 4 is a schematic cross-sectional view showing a state in which the conductive film has been patterned into first electrodes and an auxiliary electrode.

FIG. 4 is a schematic cross-sectional view showing the state in which the conductive film 121 has been patterned into first electrodes 120 and an auxiliary electrode 130.

Figure 5:
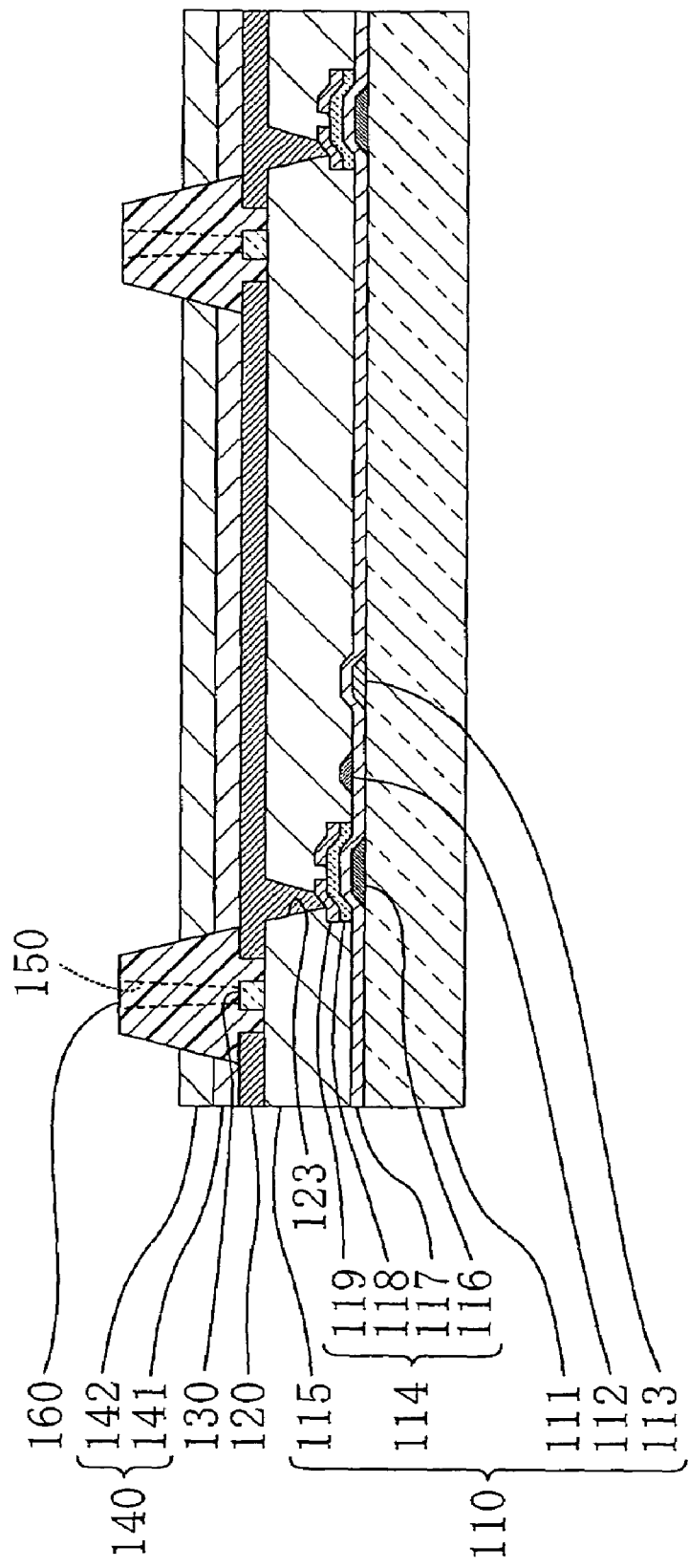
FIG. 5 is a schematic cross-sectional view showing a state in which organic layers have been formed by an ink jet method.

FIG. 5 is a schematic cross-sectional view showing the state in which organic layers 140 have been formed by an ink jet method.

First, source electrodes 112, gate electrodes 113, TFTs 114 and a smoothing film 115 are sequentially formed on an insulating substrate 111 by a known film formation method and a known patterning method.

After the smoothing film 115 is formed, a conductive film 121 of a conductive material such as Al is formed on the insulating substrate 111 by a known film formation method such as a sputtering method (see FIG. 3). First electrodes 120 and an auxiliary electrode 130 are simultaneously formed by patterning the conductive film 121 into a desired shape by photolithography technology (see FIG. 4).

Note that when organic layers 140 are formed by an ink jet method, it is preferable to make the respective surfaces of the first electrodes 120 lyophilic by treatment with UV/O$_3$ or the like before formation of the organic layers 140. This improves compatibility between the first electrodes 120 and the organic layers 140 and therefore enables formation of more uniform organic layers 140. As a result, a defect-free organic display element 100 can be implemented.

After the first electrodes 120 and the auxiliary electrode 130 are formed, an insulating layer 160 is formed on the insulating substrate 111. For example, the insulating layer 160 can be formed by the following method. First, a thin film such as a photosensitive polyimide is formed by known film formation technology such as a spin coating method. The insulating layer 160 can be formed by patterning the formed thin film into a desired shape by a series of photoresist steps such as photoresist application, prebaking, exposure, development, postbaking, etching, and photoresist removal.

Note that when the organic layers 140 are formed by an ink jet method, it is preferable to provide a liquid repelling property (a property to repel liquid containing a material of the organic layers 140) to the insulating layer 160 before formation of the organic layers 140. This effectively suppresses misplacement of droplets containing the material of the organic layers 140. For example, a liquid repelling property can be provided to the insulating layer 160 by treatment with oxygen plasma, treatment with carbon tetrafluoride plasma, or the like.

The organic layers 140 are then formed by forming a hole transfer layer 141 and a light-emitting layer 142 on the first electrodes 120 arranged in a matrix by the insulating film 160 by an ink jet method or the like (see FIG. 5). The use of an ink jet method enables the organic layers 140 to be formed at low cost with a relatively small number of manufacturing steps.

After the organic layers 140 are formed, a second electrode 170 is formed on the substrate 110. The second electrode 170 can be formed by a sputtering method or the like.

The present embodiment relates to an active matrix type organic EL display element having TFTs 114 respectively corresponding to pixels. However, the present invention is not limited to this. The present invention is also applicable to a passive matrix type organic EL display element.

Figure 6:
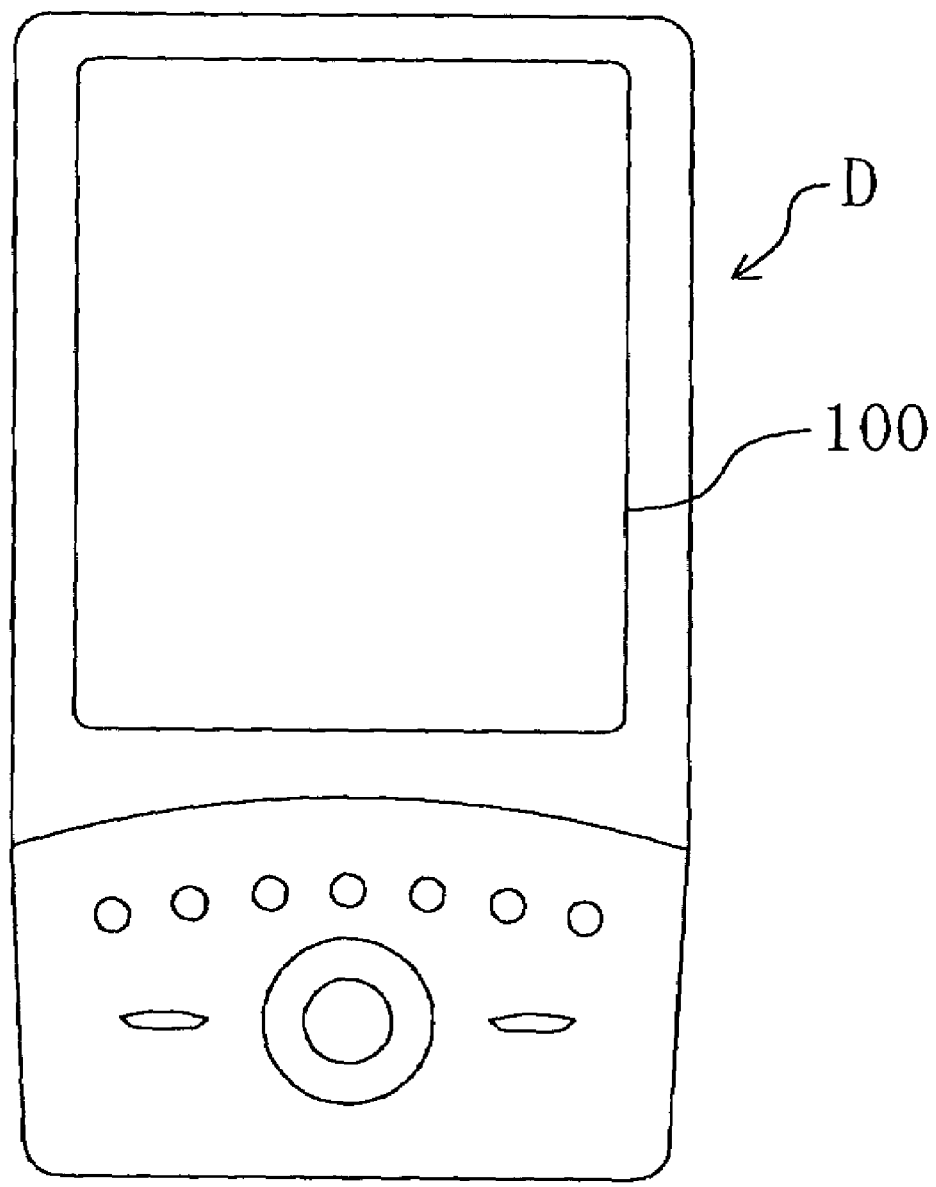
FIG. 6 is a schematic plan view showing the structure of an organic EL display device according to an embodiment of the present invention.
Figure 7:
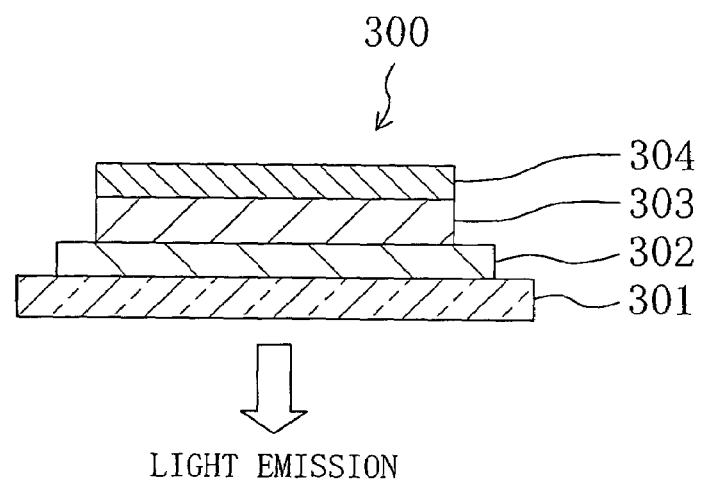
FIG. 7 is a schematic cross-sectional view of a conventional organic EL display device.
Figure 8:
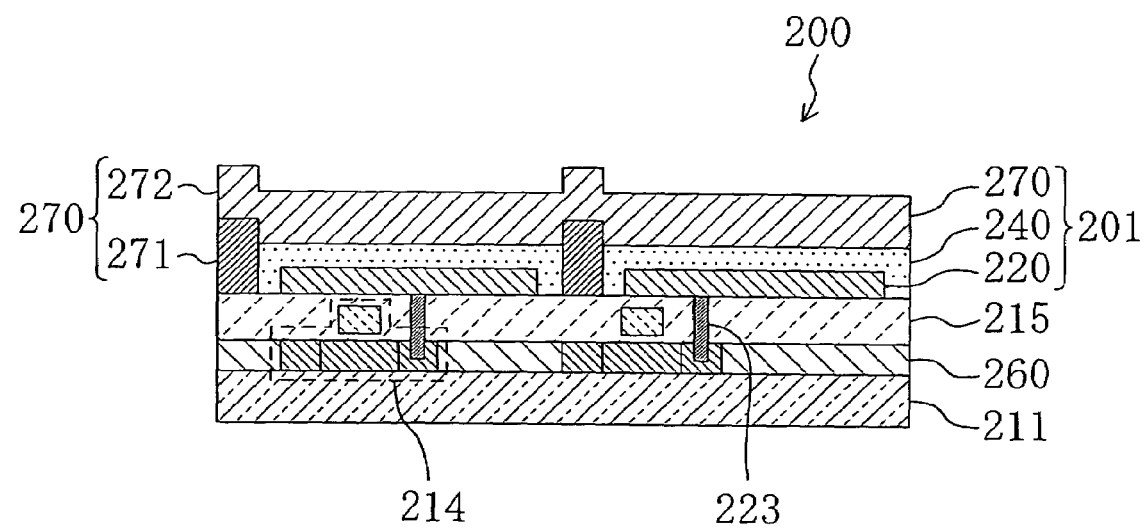
FIG. 8 shows a top-emission type organic EL display device described in U.S. Pat. No. 6,538,374.

FIG. 6 is a schematic plan view showing the structure of an organic EL display device D according to the present embodiment.

The organic EL display device D includes the organic EL display element 100 of the present embodiment. As described above, the organic EL display element 100 is capable of providing image display having high, less uneven luminance and can be manufactured at low cost. Accordingly, the organic EL display device D having the organic EL display element 100 is also capable of providing image display having high, less uneven luminance and can be manufactured at low cost.

While the present invention has been described in a preferred embodiment, it will be apparent to those skilled in the art that the disclosed invention may be modified in numerous ways and may assume many embodiments other than that specifically set out and described above. Accordingly, it is intended by the appended claims to cover all modifications of the invention that fall within the true spirit and scope of the invention.

What is claimed is:

1. An organic electroluminescent display element, comprising:
   a substrate;
   a plurality of first electrodes arranged in a prescribed pattern on the substrate;
   an auxiliary electrode provided between the plurality of first electrodes on the substrate and separated from the plurality of first electrodes;
   an insulating layer covering the auxiliary electrode, separating and isolating the plurality of first electrodes from each other, and having through holes extending to the auxiliary electrode;
   an organic layer provided directly on each of the plurality of first electrodes which are separated from each other by the insulating layer;
   a second electrode covering a whole surface of the insulating layer and the organic layers and allowing light emitted in the organic layers to transmit therethrough; and
   a conductive material provided in the through holes, for electrically connecting the auxiliary electrode to the second electrode.

2. The organic electroluminescent display element according to claim 1, wherein the first electrodes and the auxiliary electrode are formed from a same material.

3. The organic electroluminescent display element according to claim 1, wherein the through holes are formed away from the organic layers.

4. The organic electroluminescent display element according to claim 1, wherein an inner wall of each of the through holes is separated by at least 5 μm from a contact surface between the insulating layer and the second electrode and a corresponding one of the organic layers.

5. An organic electroluminescent display device, comprising an organic electroluminescent display element including
   a substrate,
   a plurality of first electrodes arranged in a prescribed pattern on the substrate, an auxiliary electrode provided between the plurality of first electrodes on the substrate and separated from the plurality of first electrodes, an insulating layer covering the auxiliary electrode, separating and isolating the plurality of first electrodes from each other, and having through holes extending to the auxiliary electrode, an organic layer provided directly on each of the plurality of first electrodes which are separated from each other by the insulating layer, a second electrode covering a whole surface of the insulating layer and the organic layers and allowing light emitted in the organic layers to transmit therethrough, and a conductive material provided in the through holes, for electrically connecting the auxiliary electrode to the second electrode.

6. A method for manufacturing an organic electroluminescent display element including a substrate, a plurality of first electrodes arranged in a prescribed pattern on the substrate, an auxiliary electrode provided between the plurality of first electrodes on the substrate and separated from the plurality of first electrodes, an insulating layer covering the auxiliary electrode, separating and isolating the plurality of first electrodes from each other, and having through holes extending to the auxiliary electrode, an organic layer provided on each of the plurality of first electrodes which are separated from each other by the insulating layer, a second electrode covering a whole surface of the insulating layer and the organic layers and allowing light emitted in the organic layers to transmit therethrough, and a conductive material provided in the through holes, for electrically connecting the auxiliary electrode to the second electrode, the method comprising:

a first step of simultaneously forming the plurality of first electrodes and the auxiliary electrode from a same material; and a second step of forming the insulating layer so that the insulating layer covers the auxiliary electrode.

7. The method according to claim 6, wherein the organic layers are formed by an ink jet method.

* * * * *